(12) United States Patent
Lee et al.

(10) Patent No.: US 10,541,669 B2
(45) Date of Patent: Jan. 21, 2020

(54) BULK ACOUSTIC RESONATOR

(71) Applicant: SAMSUNG ELECTRO-MECHANICS CO., LTD., Suwon-si (KR)

(72) Inventors: Tae Kyung Lee, Suwon-si (KR); Hwa Sun Lee, Suwon-si (KR); Hyun Min Hwang, Suwon-si (KR); Moon Chul Lee, Suwon-si (KR); Sung Sun Kim, Suwon-si (KR); Tae Yoon Kim, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 378 days.

(21) Appl. No.: 15/486,806

(22) Filed: Apr. 13, 2017

(65) Prior Publication Data
US 2018/0048287 A1 Feb. 15, 2018

(30) Foreign Application Priority Data
Aug. 12, 2016 (KR) .......................... 10-2016-0103168

(51) Int. Cl.
*H03H 9/17* (2006.01)
*H01L 41/047* (2006.01)
*H01L 41/18* (2006.01)

(52) U.S. Cl.
CPC ......... *H03H 9/177* (2013.01); *H01L 41/0477* (2013.01); *H01L 41/18* (2013.01); *H03H 9/171* (2013.01)

(58) Field of Classification Search
CPC .... H03H 9/177; H03H 9/02118; H03H 9/171; H03H 9/173; H01L 41/0477; H01L 41/18
See application file for complete search history.

(56) References Cited

U.S. PATENT DOCUMENTS

| | | | |
|---|---|---|---|
| 7,388,454 B2* | 6/2008 | Ruby | H03H 3/02 310/322 |
| 7,795,781 B2* | 9/2010 | Barber | H03H 3/02 310/320 |
| 7,952,257 B2* | 5/2011 | Iwaki | H03H 9/174 310/320 |
| 8,791,776 B2* | 7/2014 | Pang | H03H 9/02086 310/312 |
| 9,401,692 B2* | 7/2016 | Burak | H03H 9/132 |
| 9,490,418 B2* | 11/2016 | Burak | H03H 9/02118 |
| 9,853,626 B2* | 12/2017 | Burak | H03H 9/132 |
| 9,970,764 B2* | 5/2018 | Ayazi | G01C 19/5698 |
| 9,991,871 B2* | 6/2018 | Zou | H01L 41/047 |
| 10,284,173 B2* | 5/2019 | Burak | H03H 9/132 |
| 2006/0071736 A1 | 4/2006 | Ruby et al. | |

(Continued)

FOREIGN PATENT DOCUMENTS

JP 2013-123184 A 6/2013
KR 10-2006-0134866 A 12/2006

*Primary Examiner* — J. San Martin
(74) *Attorney, Agent, or Firm* — NSIP Law

(57) ABSTRACT

A bulk acoustic resonator may include a substrate; a resonating portion including a first electrode layer, a piezoelectric layer, and a second electrode layer which are sequentially stacked on the substrate, and partitioned into an active region and a non-active region; and a frame electrode layer including frame electrodes disposed within the active region to be spaced apart from each other along an outer circumference portion of the active region.

20 Claims, 9 Drawing Sheets

(56) References Cited

U.S. PATENT DOCUMENTS

| | | | |
|---|---|---|---|
| 2006/0103492 A1 | 5/2006 | Feng et al. | |
| 2011/0298564 A1* | 12/2011 | Iwashita | H03H 3/02 333/187 |
| 2013/0147577 A1 | 6/2013 | Nishihara et al. | |
| 2014/0203686 A1* | 7/2014 | Song | H01L 41/314 310/326 |
| 2014/0225683 A1* | 8/2014 | Burak | H03H 9/173 333/187 |
| 2018/0041189 A1* | 2/2018 | Lee | H03H 3/02 |

* cited by examiner

BULK ACOUSTIC RESONATOR

CROSS-REFERENCE TO RELATED APPLICATION(S)

This application claims benefit under 35 USC 119(a) of priority to Korean Patent Application No. 10-2016-0103168, filed on Aug. 12, 2016 in the Korean Intellectual Property Office, the entire disclosure of which is incorporated herein by reference for all purposes.

BACKGROUND

1. Field

The present disclosure relates to a bulk acoustic resonator.

2. Description of Related Art

With the recent rapid development of mobile communications devices, chemical and biological devices, and the like, the demand for compact and lightweight filters, oscillators, resonant elements, and acoustic resonant mass sensors used in the above-mentioned devices have also recently increased.

Bulk acoustic resonators are conventionally used to implement the compact and lightweight filters, the oscillators, the resonant elements, and the acoustic resonant mass sensors. Bulk acoustic resonators are mass-produced at a minimal cost and may be implemented in a very small size. Further, bulk acoustic resonators may be implemented to have a high quality factor Q value and may even be used in a micro-frequency band, and may particularly be implemented in frequency bands used in a device, personal communications systems (PCS) and digital cordless systems (DCS).

The bulk acoustic resonator has a resonating part, implemented by sequentially stacking a lower electrode, a piezoelectric layer, and an upper electrode on a substrate. When electric energy is applied to the first and second electrodes to induce an electric field within the piezoelectric layer, the electric field causes a piezoelectric phenomenon in the piezoelectric layer that vibrates the resonating part in a predetermined direction. As a result, an acoustic wave occurs in the same direction as the vibration direction of the resonating part, to cause resonance.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a bulk acoustic resonator includes a resonating portion and a frame electrode layer. The resonating portion includes a first electrode layer, a piezoelectric layer, and a second electrode layer sequentially stacked on a substrate. The substrate has an active region and a non-active region. The frame electrode layer includes frame electrodes disposed within the active region to be spaced apart from each other along an outer circumference portion of the active region.

The frame electrode layer may further comprise divided portions, respectively, formed between adjacent frame electrodes.

As a total length of the plurality of divided portions increases, a square value of an effective electromechanical coupling coefficient may increase.

A ratio of a length of each of the frame electrodes to a length of each of the divided portions may be 20% to 200%.

The active region may correspond to a region in which the first electrode layer, the piezoelectric layer, and the second electrode layer are overlapped in a vertical direction.

The first electrode layer and the second electrode layer may be formed of one or any combination of gold (Au), titanium (Ti), tantalum (Ta), molybdenum (Mo), ruthenium (Ru), platinum (Pt), tungsten (W), aluminum (Al), nickel (Ni), and iridium (Ir), and an alloy thereof.

The piezoelectric layer may be formed of one or any of aluminum nitride (AlN), zinc oxide (ZnO), and lead zirconium titanium oxide (PZT; PbZrTiO).

The piezoelectric layer may include a rare earth metal, and the rare earth metal includes at least one of scandium (Sc), erbium (Er), yttrium (Y), and lanthanum (La).

The piezoelectric layer may include the rare earth metal having 1 at. % to 20 at. %.

In another general aspect, a bulk acoustic resonator includes a resonating portion and a frame electrode layer. The resonating portion includes a first electrode layer, a piezoelectric layer, and a second electrode layer sequentially stacked on a substrate, the substrate partitioned into an active region and a non-active region. The frame electrode layer includes convex portions and concave portions alternately and respectively formed within the active region, along an outer circumference portion of the active region.

A thickness of each of the convex portions may be thicker than that of each of the concave portions.

As a total length of the concave portions increase, a square value of the effective electromechanical coupling coefficient may increase.

A ratio of a length of each of the convex portions to a length of each of the concave portions may be 20% to 200%.

The active region may correspond to a region in which the first electrode layer, the piezoelectric layer, and the second electrode layer are overlapped in a vertical direction.

The piezoelectric layer may include a rare earth metal, and the rare earth metal includes one or any combination of scandium (Sc), erbium (Er), yttrium (Y), and lanthanum (La).

The piezoelectric layer may include the rare earth metal having 1 at. % to 20 at. %.

In another general aspect, a bulk acoustic resonator includes a piezoelectric layer and a frame electrode layer. The piezoelectric layer is disposed on a substrate having an active region and a non-active region, the piezoelectric layer between a first electrode layer and a second electrode layer. The frame electrode layer is disposed on the second electrode in the active region. The frame electrode layer includes an annular arrangement of spaced protrusions.

The frame electrode layer may be supported by an annular ring.

The frame electrode layer may be disposed directly on the second electrode.

The annular arrangement of spaced protrusions may define gaps therebetween.

Other features and aspects will be apparent from the following detailed description, the drawings, and the claims.

BRIEF DESCRIPTION OF DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
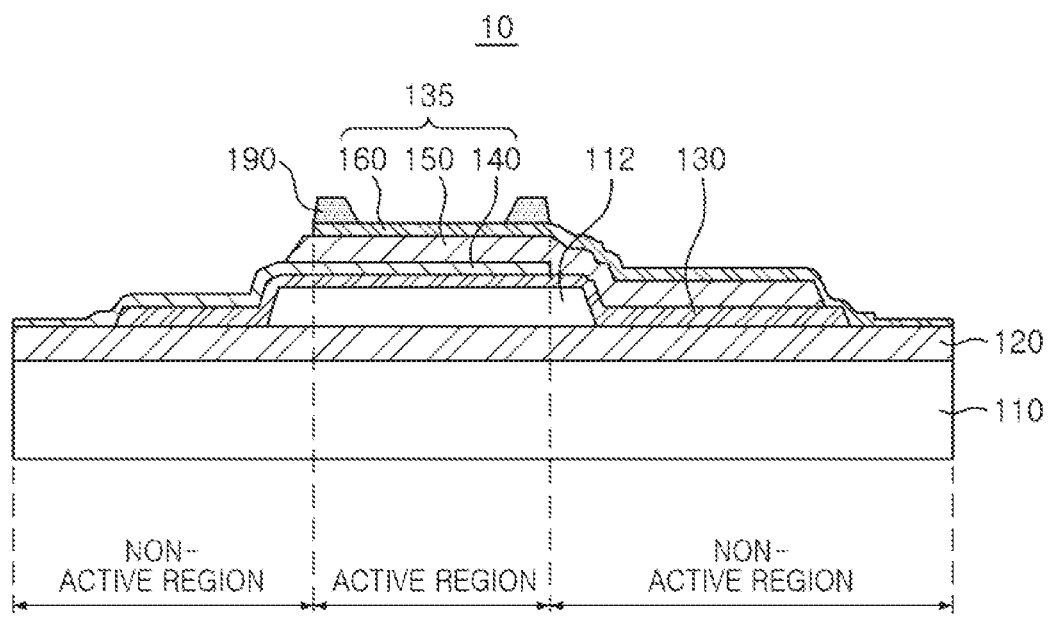
FIG. 1 is a cross-sectional view illustrating an example of a bulk acoustic resonator.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes shown in the drawings may occur. Thus, the examples described herein are not limited to the specific shapes shown in the drawings, but include changes in shape that occur during manufacturing.

The features of the examples described herein may be combined in various ways as will be apparent after an understanding of the disclosure of this application. Further, although the examples described herein have a variety of configurations, other configurations are possible as will be apparent after an understanding of the disclosure of this application.

Figure 2:
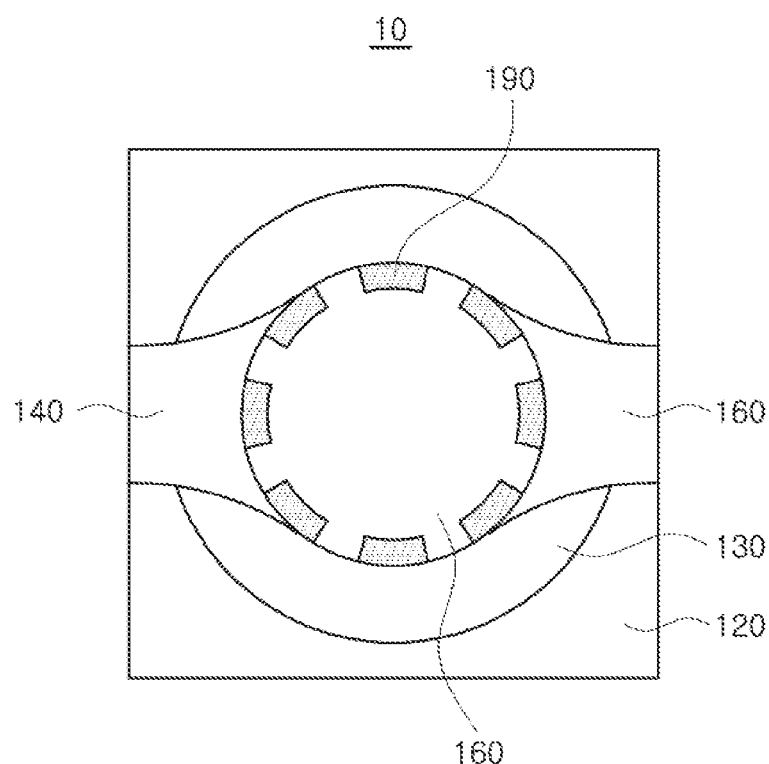
FIG. 2 is a top view illustrating an example of a bulk acoustic resonator.

FIG. 1 is a cross-sectional view illustrating an example of a bulk acoustic resonator and FIG. 2 is a top view illustrating an example of a bulk acoustic resonator.

Bulk acoustic resonator 10 is a film bulk acoustic resonator (hereinafter, referred to as FBAR). Referring to FIG. 1, the bulk acoustic resonator 10 includes a substrate 110, an insulating layer 120, an air cavity 112, a membrane 130, a resonating part 135, and a frame electrode layer 190.

The substrate 110 may be formed of a silicon substrate, and the insulating layer 120 is formed on a top surface of the substrate 110 to electrically isolate the substrate 110 and the resonating part 135 from each other.

The insulating layer 120 is formed on the substrate 110 by performing a chemical vapor deposition, an RF magnetron sputtering, or an evaporation for one or any combination of silicon dioxide ($SiO_2$), silicon nitride ($Si_3N_4$), aluminum oxide ($Al_2O_3$), and aluminum nitride (AlN).

The air cavity 112 is formed on the insulating layer 120. The air cavity 112 is disposed below the resonating part 135, so that the resonating part 135 vibrates in a predetermined direction. The air cavity 112 may be formed by an etching process of forming an air cavity sacrificial layer pattern on the insulating layer 120, forming the membrane 130 on the air cavity sacrificial layer pattern, and then etching and removing the air cavity sacrificial layer pattern.

The membrane 130 is formed on the air cavity 112 and the insulating layer 120 by performing chemical vapor deposition, RF magnetron sputtering, or evaporation for one or any combination of silicon dioxide ($SiO_2$), silicon nitride ($Si_3N_4$), aluminum oxide ($Al_2O_3$), and aluminum nitride (AlN).

An etching stop layer may be further formed between the insulating layer 120 and the air cavity 112. The etching stop layer may serve to protect the substrate 110 and the insulating layer 120 from the etching process during removal of the sacrificial layer pattern and may also serve as a base required to deposit various other layers.

The resonating part 135 includes a first electrode layer 140, a piezoelectric layer 150, and a second electrode layer 160. The first electrode layer 140, the piezoelectric layer 150, and the second electrode layer 160 are sequentially stacked.

The first electrode layer 140 is extended to the membrane 130 above the air cavity 112 from an upper portion of one side of the insulating layer 120. The piezoelectric layer 150 is formed on the first electrode layer 140 above the air cavity 112, and the second electrode layer 160 is formed on the piezoelectric layer 150 above the air cavity 112 from an upper portion of the other side of the insulating layer 120. The common region of the first electrode layer 140, the piezoelectric layer 150, and the second electrode layer 160, which are overlapped in a vertical direction, are positioned above the air cavity 112.

The first electrode layer 140 and the second electrode layer 160 may be formed of one of gold (Au), titanium (Ti), tantalum (Ta), molybdenum (Mo), ruthenium (Ru), platinum (Pt), tungsten (W), aluminum (Al), nickel (Ni), and iridium (Ir), or an alloy thereof.

The piezoelectric layer 150 is a portion responding to a piezoelectric effect and converts electric energy into mechanical energy in the form of an acoustic wave, and may be formed of one of aluminum nitride (AlN), zinc oxide (ZnO), and lead zirconium titanium oxide (PZT; PbZrTiO). In addition, the piezoelectric layer 150 may further include a rare earth metal. As an example, the rare earth metal may include one or any combination of scandium (Sc), erbium (Er), yttrium (Y), and lanthanum (La). The piezoelectric layer 150 may include a rare earth metal having 1 to 20 at. % (atomic percent).

The resonating part 135 is partitioned into an active region and a non-active region. The active region of the resonating part 135 is a region that vibrates and resonates in a predetermined direction due to the piezoelectric phenomenon occurring in the piezoelectric layer 150 when electric energy such as a radio frequency (RF) signal is applied to the first electrode layer 140 and the second electrode layer 160, and may correspond to a region in which the first electrode layer 140, the piezoelectric layer 150, and the second electrode layer 160 are overlapped in a vertical direction above the air cavity 112. The inactive region of the resonating part is a region that does not resonate due to the piezoelectric phenomenon even though the electric energy is applied to the first electrode layer 140 and the second electrode layer 160, and corresponds to an outer region of the active region.

The resonating part 135 outputs an RF signal having a specific frequency. Specifically, the resonating part 135 outputs an RF signal having a resonance frequency corresponding to the vibration due to the piezoelectric phenomenon of the piezoelectric layer 150.

Although not illustrated in FIGS. 1 and 2, the bulk acoustic resonator 10 may further include an electrode pad for applying an electrical signal to the first electrode layer 140 and the second electrode layer 160, and a passivation for preventing components other than the electrode pad from being exposed to the outside. The passivation may include a silicon oxide based insulating material, a silicon nitride based insulating material, and an aluminum nitride based insulating material.

As described above, in the case in which electrical energy, such as an RF signal, is applied to the first electrode layer 140 and the second electrode layer 160, acoustic waves are generated by a piezoelectric phenomenon occurring in the piezoelectric layer 150. In this example, a lateral wave may be additionally generated from the second electrode layer 160. In a case in which the additionally generated lateral wave is not trapped, loss of the acoustic wave occurs and the quality factor of the resonator is degraded.

In order to trap the lateral wave, when an electrode layer having a ring shape is formed along an outer circumference portion of the active region, the quality factor is improved, but a square value of an effective electromechanical coupling coefficient ($Kt^2$) is degraded and spurious noise occurs.

According to an example, the frame electrode layer 190, including a plurality of frame electrodes that are disposed to be spaced apart from each other along an outer circumference portion of the active region of the resonating part 135, is formed, or the frame electrode layer 190, including a plurality of concave portions and convex portions that are alternately formed along the outer circumference portion of the active region of the resonating part 135, is formed, whereby the square value of the effective electromechanical coupling coefficient ($Kt^2$) is improved and the spurious noise is reduced.

Figure 3:
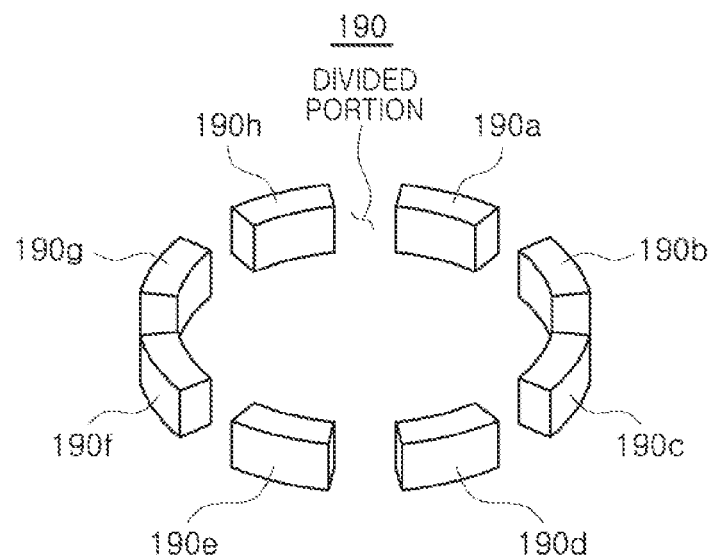
FIG. 3 is a perspective view illustrating an example of a frame electrode layer.

FIG. 3 is a perspective view illustrating a frame electrode layer.

Referring to FIG. 3, the frame electrode layer 190 includes a plurality of frame electrodes 190a to 190h. The plurality of frame electrodes 190a to 190h are disposed to be spaced apart from each other along the outer circumference portion of the active region within the active region of the resonating part 135. In this example, a region disposed between adjacent frame electrodes among the plurality of frame electrodes 190a to 190h is referred to as a divided portion. As an example, a width of the plurality of frame electrodes 190a to 190h is 3 to 5 μm.

Referring to FIG. 3, although FIG. 3 illustrates eight frame electrodes 190a to 190h, the number of the frame electrodes may be changed and is not limited thereto.

Figure 4:
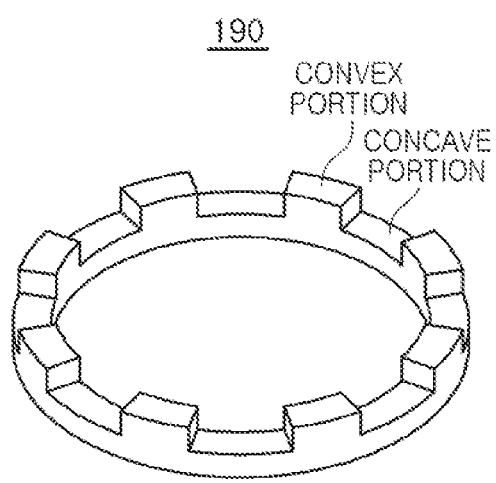
FIG. 4 is a perspective view illustrating an example of a frame electrode layer.

FIG. 4 is a perspective view illustrating an example of a frame electrode layer.

Referring to FIG. 4, the frame electrode layer 190 includes a plurality of concave portions and convex portions. The plurality of concave portions and convex portions are alternately formed along the outer circumference portion of the active region within the active region of the resonating part 135, and a thickness of each of the plurality of convex portions may be thicker than that of each of the plurality of concave portions. As an example, a width of the plurality of concave portions and convex portions is between 3 to 5 μm.

Referring to FIG. 4, although FIG. 4 illustrates alternating eight concave portions and convex portions, the number of the plurality of concave portions and convex portions are not limited thereto.

The following Table 1 illustrates numerical values of a Comparative Example (Ref) in which the frame electrode layer that is continuously connected or supported by an annular ring and formed in the active region of the resonating part and Examples (Cases 1 to 9). Table 2 is a table illustrating results obtained by measuring a square value of the effective electromechanical coupling coefficient ($Kt^2$), a peak value of spurious noise (Spurious Noise_Peak), a parallel quality factor Qp, and a series quality factor Qs of the Comparative Example (Ref), in which the frame electrode layer that is supported by an annular ring or continuously connected is formed in the active region of the resonating part and Examples (Cases 1 to 9).

TABLE 1

| | Length A [μm] | Number B | Length C [μm] | Length D [μm] | Ratio E [%] |
|---|---|---|---|---|---|
| Ref | 0 | 0 | 0 | 314 | 0 |
| Case 1 | 10 | 20 | 200 | 114 | 175.44 |
| Case 2 | 10 | 10 | 100 | 214 | 46.73 |
| Case 3 | 10 | 5 | 50 | 264 | 18.94 |
| Case 4 | 12 | 16 | 192 | 122 | 157.38 |
| Case 5 | 12 | 8 | 96 | 218 | 44.04 |
| Case 6 | 12 | 4 | 48 | 266 | 18.05 |
| Case 7 | 8 | 24 | 192 | 122 | 157.39 |
| Case 8 | 8 | 12 | 96 | 218 | 44.04 |
| Case 9 | 8 | 6 | 48 | 266 | 18.05 |

TABLE 2

| | $Kt^2$ [%] | SN_Peak [dB] | Qp | Qs |
|---|---|---|---|---|
| Ref | 5.8274 | 0.1776 | 835.15 | 94.292 |
| Case 1 | 5.9104 | 0.1635 | 671.77 | 95.999 |
| Case 2 | 5.8816 | 0.1669 | 750.81 | 91.771 |
| Case 3 | 5.8527 | 0.1572 | 752.66 | 90.469 |
| Case 4 | 5.883 | 0.1554 | 697.95 | 84.715 |
| Case 5 | 5.8534 | 0.1653 | 788.81 | 97.37 |
| Case 6 | 5.8245 | 0.1793 | 817.52 | 87.007 |
| Case 7 | 5.8845 | 0.1501 | 661.17 | 89.575 |
| Case 8 | 5.8556 | 0.1398 | 734.57 | 93.544 |
| Case 9 | 5.8267 | 0.1446 | 751.09 | 97.182 |

In the above Table 1, length A denotes a length of each of the divided portions of the frame electrode layer of FIG. 3 or a length of each of the concave portions of the frame electrode layer of FIG. 4, when a length of the outer circumference portion of the active region of the resonating part 135 is 314 [μm]. Number B denotes the number of the divided portions of the frame electrode layer of FIG. 3 or the number of the concave portions of the frame electrode layer of FIG. 4. Length C denotes a length calculated by multiplying the length A with the number B and denotes a total length of the divided portions or the concave portions of the frame electrode layer, and length D denotes a total length of the frame electrodes of FIG. 3 or the convex portions of FIG. 4. In addition, ratio E denotes a ratio of length C to length D.

Figure 5A:
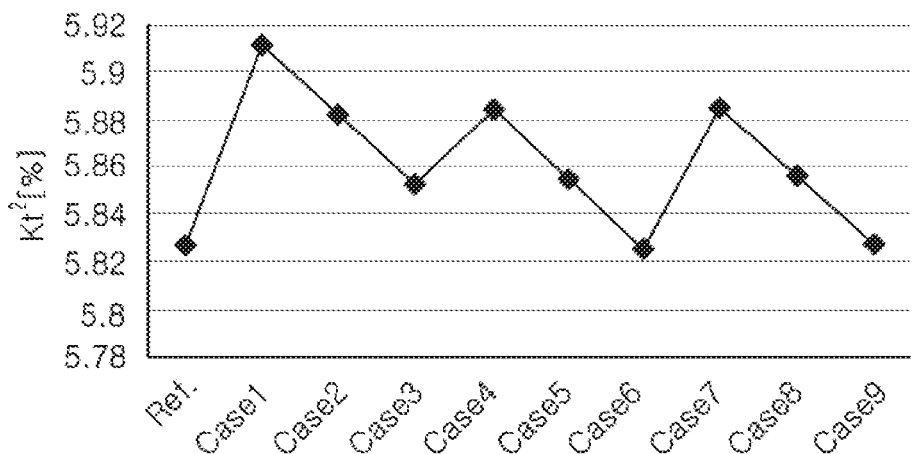
FIGS. 5A and 5B are examples of graphs illustrating results obtained by measuring a square value of the effective electromechanical coupling coefficient ($Kt^2$).
Figure 5B:
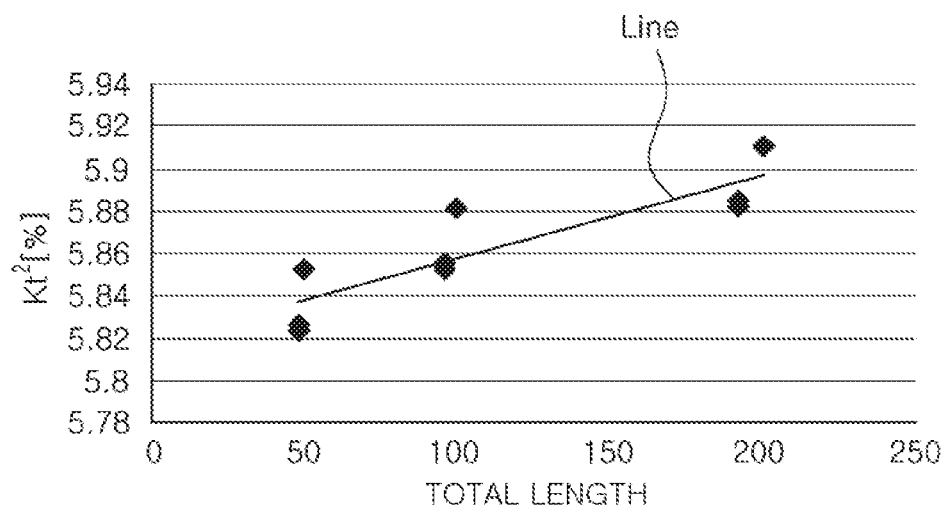

FIGS. 5A and 5B are graphs illustrating results obtained by measuring a square value of the effective electromechanical coupling coefficient ($Kt^2$).

FIG. 5A is a graph illustrating the square value of the effective electromechanical coupling coefficient of the Examples (Cases 1 to 9) of the frame electrode layer and the Comparative Example (Ref) in which the frame electrode layer that is continuously connected or supported by an annular ring is formed in the active region of the resonating part. FIG. 5B is a graph illustrating the square value of the effective electromechanical coupling coefficient according to a total length of the divided portions or the concave portions in the Examples (Cases 1 to 9) of the frame electrode layer. In FIG. 5B, the line is a graph illustrating an average value of the square value of the effective electromechanical coupling coefficient calculated based on the total length of the divided portions or the concave portions.

Referring to FIG. 5A, the Examples (Cases 6 and 9) have approximately the same square value of the effective electromechanical coupling coefficient as that of the Comparative Example (Ref), and each of the other Examples (Cases 1, 2, 3, 4, 5, 7, and 8) has a square value of the effective electromechanical coupling coefficient that is greater than that of the Comparative Example (Ref). In addition, referring to FIG. 5B, as the total length of the divided portions or the concave portions of the frame electrode layer becomes longer, the square value of the effective electromechanical coupling coefficient becomes higher.

It is seen from the results derived from the graphs illustrated in FIGS. 5A and 5B that when the frame electrode layer having the divided portions or the concave portions is formed, the square value of the effective electromechanical coupling coefficient is generally improved.

In addition, it is seen that the square value of the effective electromechanical coupling coefficient is changed according to a change of the total length of the divided portions or the concave portions of the frame electrode layer rather than a change of the number of the divided portions or the concave portions of the frame electrode layer. Specifically, as the total length of the divided portions or the concave portions of the frame electrode layer becomes longer, the square value of the effective electromechanical coupling coefficient is increased and efficiency of the resonator is improved.

Figure 6A:
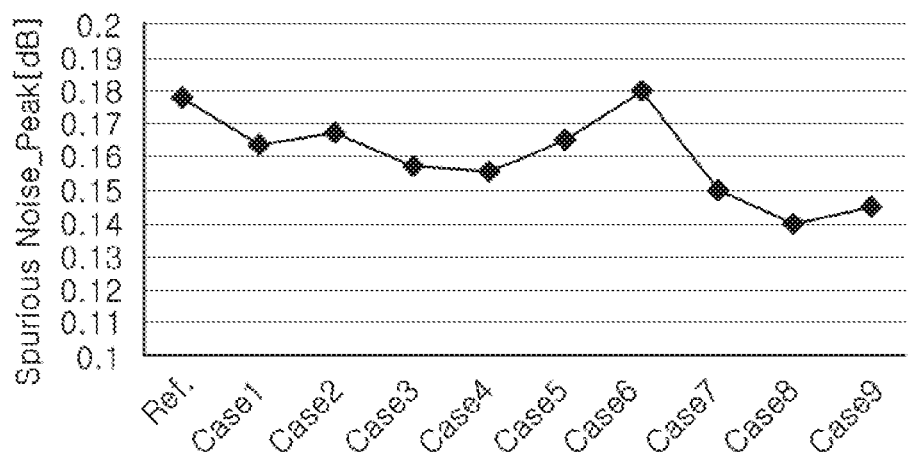
FIGS. 6A and 6B are examples of graphs illustrating results obtained by measuring a peak value of spurious noise (Spurious Noise_Peak).
Figure 6B:
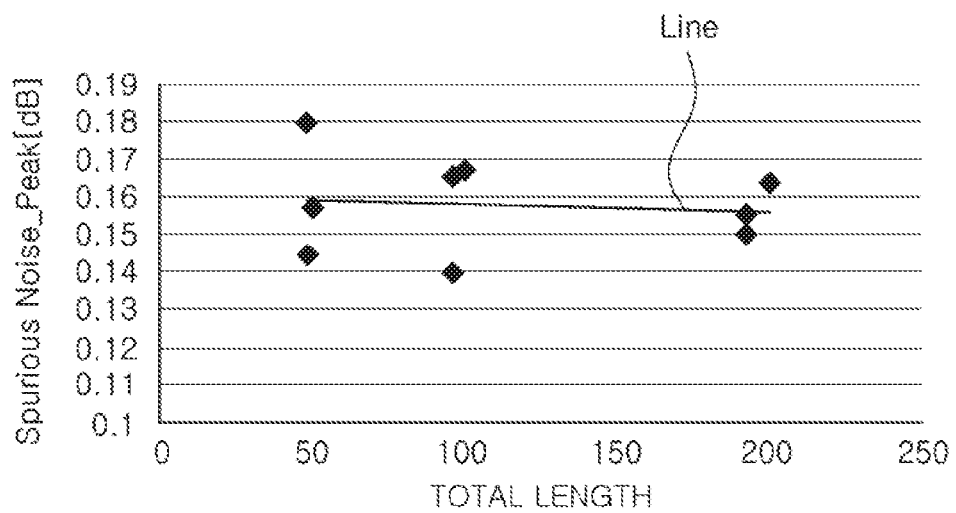

FIGS. 6A and 6B are graphs illustrating results obtained by measuring a peak value of spurious noise (Spurious Noise_Peak).

FIG. 6A is a graph illustrating the peak value of spurious noise of the Examples (Cases 1 to 9) of the frame electrode layer and the Comparative Example (Ref) in which the frame electrode layer that is continuously connected or supported by an annular ring is formed in the active region of the resonating part. FIG. 6B is a graph illustrating the peak value of spurious noise according to a total length of the divided portions or the concave portions in the Examples (Cases 1 to 9) of the frame electrode layer. In FIG. 6B, the line is a graph illustrating an average value of the peak value of spurious noise calculated based on the total length of the divided portions or the concave portions.

Referring to FIG. 6A, the Example (Case 6) has approximately the same peak value of spurious noise as that of the Comparative Example (Ref), and each of the other Examples (Cases 1, 2, 3, 4, 5, 7, 8, and 9) has a peak value of spurious noise smaller than that of the Comparative Example (Ref). In addition, referring to FIG. 6B, even in a case in which the total length of the divided portions or the concave portions of the frame electrode layer is changed, the peak value of spurious noise is approximately the same.

It is seen from the results derived from the graphs illustrated in FIGS. 6A and 6B that when the frame electrode layer having the divided portions or the concave portions is formed, the peak value of spurious noise is generally reduced as compared with the Comparative Example (Ref).

In addition, in a case in which the divided portions or the concave portions of the frame electrode layer have a specific length rather than the change of the total length of the divided portions or the concave portions of the frame electrode layer and the number of the divided portions or the concave portions of the frame electrode layer, the peak value of spurious noise is significantly reduced. Specifically, it is seen that Cases 7 to 9 have a significantly low peak value of spurious noise as compared with other Examples and the Comparative Example.

Figure 7A:
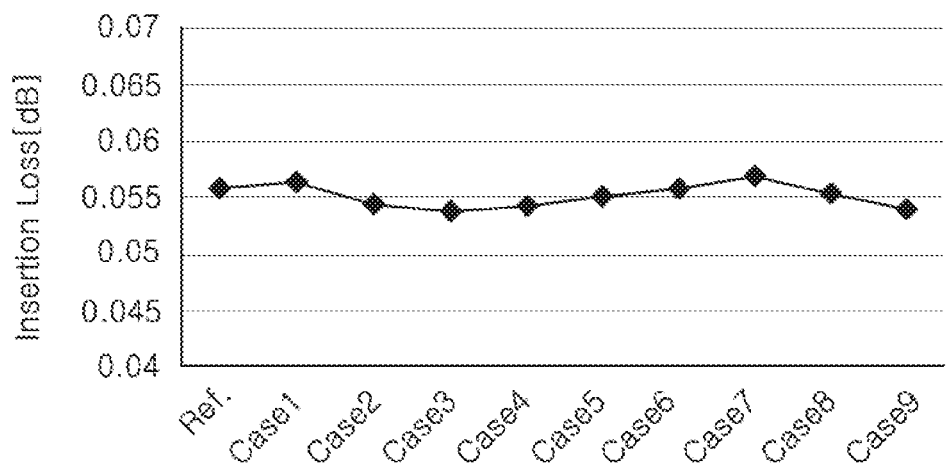
FIGS. 7A and 7B are examples of graphs illustrating results obtained by measuring insertion loss.
Figure 7B:
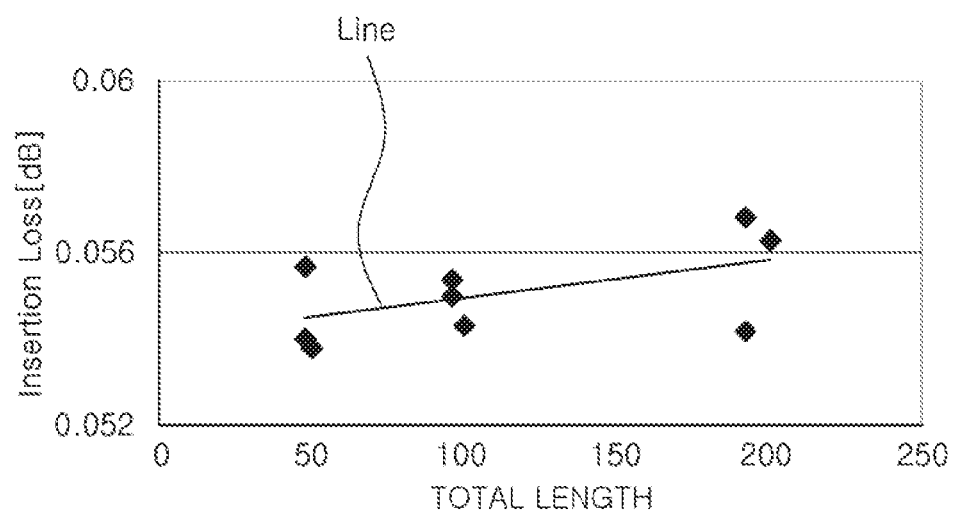

FIGS. 7A and 7B are graphs illustrating results obtained by measuring insertion loss.

FIG. 7A is a graph illustrating the insertion loss of the Examples (Cases 1 to 9) of the frame electrode layer and the Comparative Example (Ref) in which the frame electrode layer that is continuously connected or supported by an annular ring is formed in the active region of the resonating part, and FIG. 7B is a graph illustrating the insertion loss according to a total length of the divided portions or the concave portions in the Examples (Cases 1 to 9) of the frame electrode layer. In FIG. 7B, the line is a graph illustrating an average value of the insertion loss calculated based on the total length of the divided portions or the concave portions.

Referring to FIG. 7A, each of the Examples (Cases 1 to 9) has approximately the same insertion loss as that of the Comparative Example (Ref). In FIG. 7B, even in cases in which the total length of the divided portions or the concave portions of the frame electrode layer is changed, the insertion loss is approximately the same.

It is seen from the results derived from the graphs illustrated in FIGS. 7A and 7B that the number and the total length of the divided portions or the concave portions of the frame electrode layer do not have a specific tendency for the insertion loss. However, since the insertion loss is not changed as compared with the Comparative Example (Ref) even in cases in which the frame electrode layer having the divided portions or the concave portions is formed, the quality factor of the bulk acoustic resonator is improved as compared with the bulk acoustic resonator in which the electrode layer of the ring shape is not formed in the resonating part of the active region.

Figure 8:
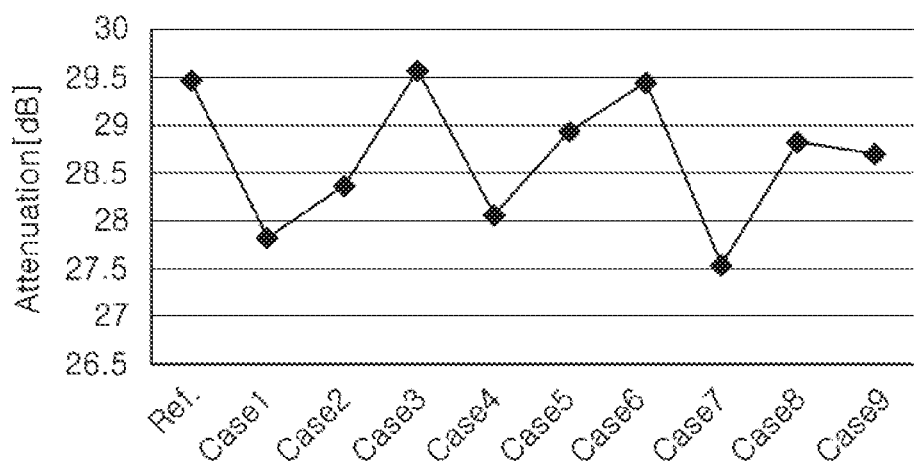
FIG. 8 is a graph illustrating an example of a result obtained by measuring attenuation characteristics.

FIG. 8 is a graph illustrating a result obtained by measuring attenuation characteristics. FIG. 8 is a graph illustrating the attenuation characteristics of the Examples (Cases 1 to 9) of the frame electrode layer and the Comparative Example (Ref) in which the frame electrode layer that is continuously connected is formed in the active region of the resonating part.

Referring to FIG. 8, it is seen that the Examples (Cases 3 and 6) have approximately the same attenuation characteristics as that of the Comparative Example (Ref), and each of the other Examples (Cases 1, 2, 4, 5, 7, 8, and 9) has an attenuation characteristic lower than that of the Comparative Example (Ref).

Referring to Table, 1, Table 2, and FIG. 8, it is seen that the attenuation characteristics are changed according to the change of the total length of the divided portions or the concave portions of the frame electrode layer rather than the change of the number of the divided portions or the concave portions of the frame electrode layer. Specifically, as the total length of the divided portions or the concave portions of the frame electrode layer becomes shorter, the attenuation characteristics improve. Specifically, it is seen that Cases 3 and 6 have better attenuation characteristics than other Examples, and both have approximately the same performance as that of the Comparative Example.

Figure 9A:
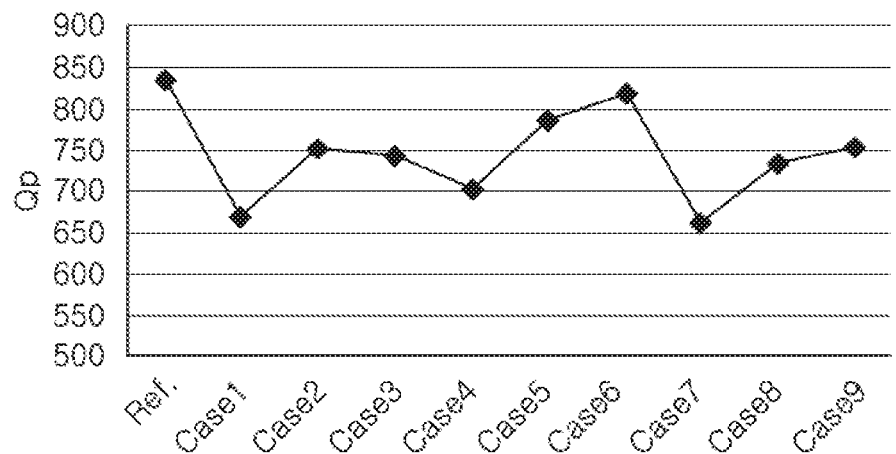
FIGS. 9A and 9B are examples of graphs illustrating results obtained by measuring a quality factor.
Figure 9B:
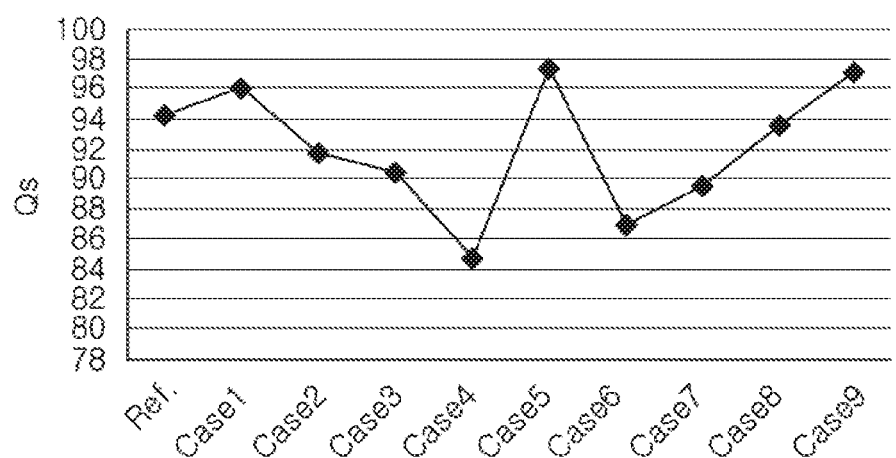

FIGS. 9A and 9B are graphs illustrating results obtained by measuring a quality factor.

FIGS. 9A and 9B are graphs respectively illustrating a parallel quality factor Qp and a series quality factor Qs of the Examples (Cases 1 to 9) of the frame electrode layer and the Comparative Example (Ref) in which the frame electrode layer that is continuously connected or supported by an annular ring is formed in the active region of the resonating part.

Referring to FIG. 9A, it is seen that the Examples (Cases 5 and 6) have approximately the same parallel quality factor as that of the Comparative Example (Ref), and each of the other Examples (Cases 1 to 4, 7, 8, and 9) has a parallel quality factor that is lower than that of the Comparative Example (Ref).

In addition, referring to FIG. 9B, it is seen that the Examples (Cases 1, 5 and 9) have approximately the same series quality factor as that of the Comparative Example (Ref), and each of the other Examples (Cases 2 to 4, and 6 to 8) has a series quality factor that is lower than that of the Comparative Example (Ref).

It is seen from the results derived from the graphs illustrated in FIGS. 9A and 9B that the number and the total length of the divided portions or the concave portions of the frame electrode layer do not have a specific tendency for the parallel and series quality factors. However, as in the Case 5, when the divided portions or the concave portions of the frame electrode layer have the specific length, number, and total length in Table 1, the parallel and series quality factors is improved.

Figure 10A:
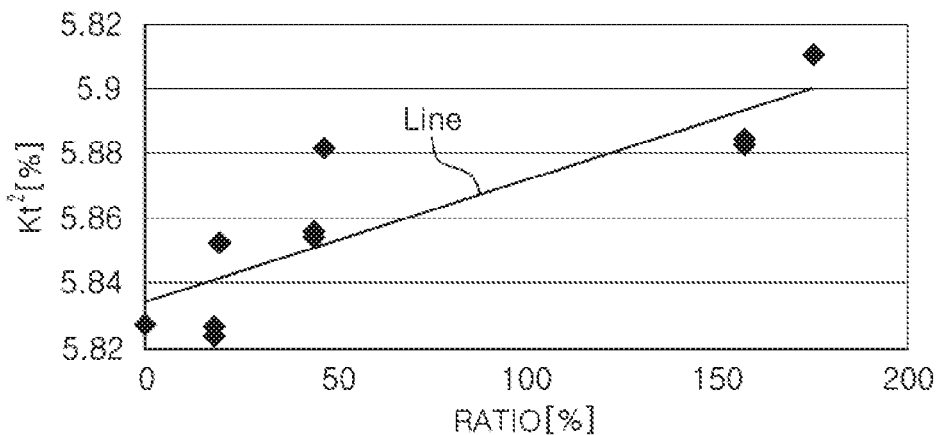
FIGS. 10A and 10B are examples of graphs illustrating results obtained by measuring a square value of the effective electromechanical coupling coefficient ($Kt^2$) and a parallel quality factory Qp, according to a ratio of a total length of frame electrodes or convex portions to a total length of divided portions or concave portions.
Figure 10B:
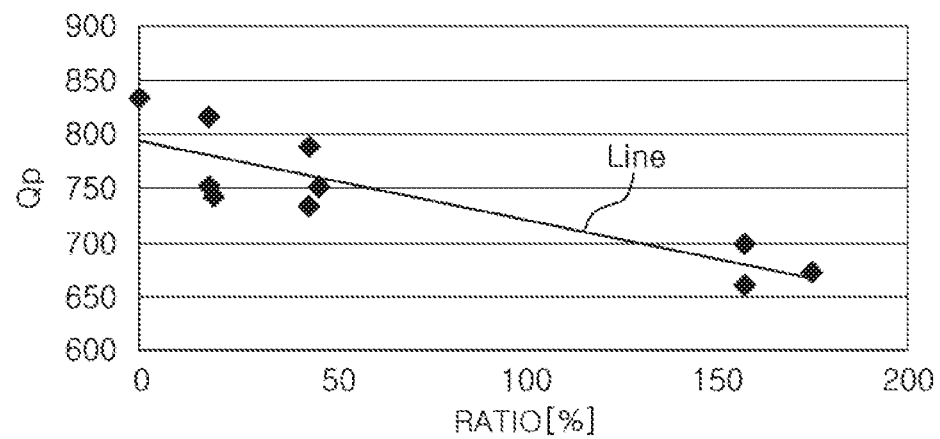

FIGS. 10A and 10B are graphs illustrating results obtained by measuring a square value of the effective electromechanical coupling coefficient ($Kt^2$) and a parallel quality factory Qp according to a ratio of a total length of frame electrodes or convex portions to a total length of divided portions or concave portions.

FIG. 10A is a graph illustrating a result obtained by measuring a square value of the effective electromechanical coupling coefficient ($Kt^2$) according to a ratio of a total length of frame electrodes or convex portions to a total length of divided portions or concave portions.

FIG. 10B is a graph illustrating a result obtained by measuring a parallel quality factor Qp according to a ratio of a total length of frame electrodes or convex portions to a total length of divided portions or concave portions. In FIGS. 10A and 10B, the line illustrates an average value of the square value of the effective electromechanical coupling coefficient and an average value of the parallel quality factor.

Referring to FIG. 10A, Table 1, and Table 2, it is seen that when the ratio is 20 to 200%, the square value of the effective electromechanical coupling coefficient ($Kt^2$) is increased as compared with the Comparative Example (Ref). However, referring to FIG. 10B, Table 1, and Table 2, when the ratio is increased to 200% or more, the parallel quality factor is rapidly decreases.

Figure 11:
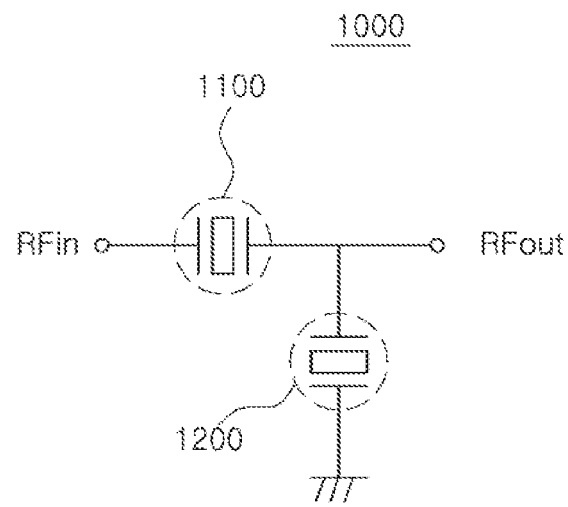
FIGS. 11 and 12 are schematic circuit diagrams of an example of a filter.
Figure 12:
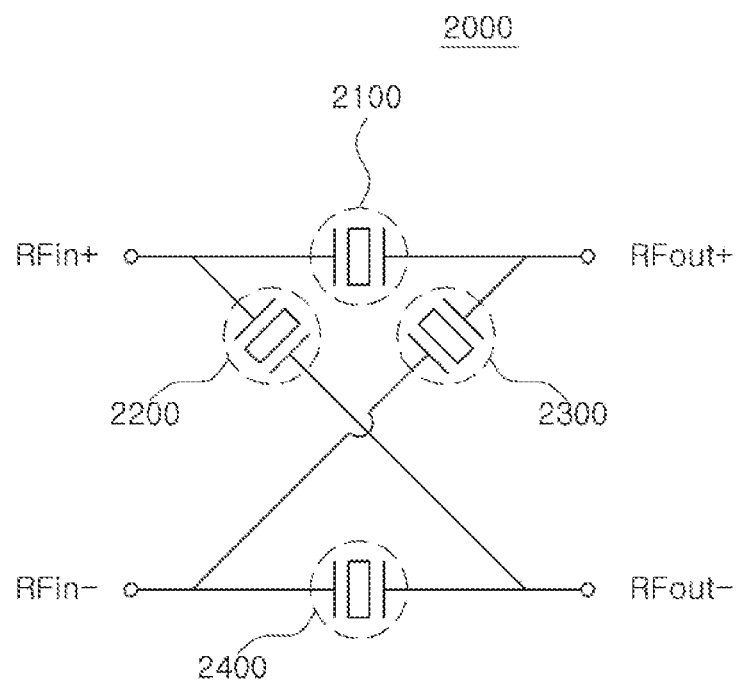

FIGS. 11 and 12 are schematic circuit diagrams of a filter according to the examples in the present disclosure. Each of a plurality of bulk acoustic resonators employed in the filters of FIGS. 11 and 12 corresponds to the bulk acoustic resonator illustrated in FIG. 1.

Referring to FIG. 11, a filter 1000 includes a filter structure of a ladder type. Specifically, the filter 1000 includes a plurality of bulk acoustic resonators 1100 and 1200.

A first bulk acoustic resonator 1100 is connected in series between a signal input terminal to which an input signal RFin is input and a signal output terminal from which an output signal RFout is output, and a second bulk acoustic resonator 1200 is connected between the signal output terminal and a ground.

Referring to FIG. 12, a filter 2000 includes a filter structure of a lattice type. Specifically, the filter 2000 includes a plurality of bulk acoustic resonators 2100, 2200, 2300, and 2400 to filter balanced input signals RFin+ and RFin− to output balanced output signals RFout+ and RFout−.

As set forth above, according to the exemplary embodiments in the present disclosure, the bulk acoustic resonator may improve the square value of the effective electromechanical coupling coefficient ($Kt^2$) and reduce the spurious noise.

As a non-exhaustive example only, a device as described herein may be a mobile device, such as a cellular phone, a smart phone, a wearable smart device (such as a ring, a watch, a pair of glasses, a bracelet, an ankle bracelet, a belt, a necklace, an earring, a headband, a helmet, or a device embedded in clothing), a portable personal computer (PC) (such as a laptop, a notebook, a subnotebook, a netbook, or an ultra-mobile PC (UMPC), a tablet PC (tablet), a phablet, a personal digital assistant (PDA), a digital camera, a portable game console, an MP3 player, a portable/personal multimedia player (PMP), a handheld e-book, a global positioning system (GPS) navigation device, or a sensor, or a stationary device, such as a desktop PC, a high-definition television (HDTV), a DVD player, a Blu-ray player, a set-top box, or a home appliance, or any other mobile or stationary device configured to perform wireless or network communication. In one example, a wearable device is a device that is designed to be mountable directly on the body of the user, such as a pair of glasses or a bracelet. In another example, a wearable device is any device that is mounted on the body of the user using an attaching device, such as a smart phone or a tablet attached to the arm of a user using an armband, or hung around the neck of the user using a lanyard.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A bulk acoustic resonator, comprising:
   a resonating portion comprising a first electrode layer, a piezoelectric layer, and a second electrode layer sequentially stacked on a substrate, wherein the substrate comprises an active region and a non-active region; and
   a frame electrode layer comprising frame electrodes disposed within the active region to be spaced apart from each other along an outer circumference portion of the active region,
   wherein a ratio of a length of each of the frame electrodes to a length of each of the divided portions is 20% to 200%.

2. The bulk acoustic resonator of claim 1, wherein the frame electrode layer further comprises divided portions respectively formed between adjacent frame electrodes.

3. The bulk acoustic resonator of claim 2, wherein, as a total length of the divided portions increases, a square value of an effective electromechanical coupling coefficient increases.

4. The bulk acoustic resonator of claim 1, wherein the active region corresponds to a region in which the first electrode layer, the piezoelectric layer, and the second electrode layer overlap in a vertical direction.

5. The bulk acoustic resonator of claim 1, wherein the first electrode layer and the second electrode layer are formed of one or any combination of gold (Au), titanium (Ti), tantalum (Ta), molybdenum (Mo), ruthenium (Ru), platinum (Pt), tungsten (W), aluminum (Al), nickel (Ni), and iridium (Ir), and an alloy thereof.

6. The bulk acoustic resonator of claim 1, wherein the piezoelectric layer is formed of one or any of aluminum nitride (AlN), zinc oxide (ZnO), and lead zirconium titanium oxide (PZT; PbZrTiO).

7. The bulk acoustic resonator of claim 1, wherein the piezoelectric layer includes a rare earth metal, and
   the rare earth metal includes at least one of scandium (Sc), erbium (Er), yttrium (Y), and lanthanum (La).

8. The bulk acoustic resonator of claim 7, wherein the piezoelectric layer includes the rare earth metal having 1 at. % to 20 at. %.

9. The bulk acoustic resonator of claim 1, wherein the frame electrode layer is disposed on a flat portion of the second electrode layer.

10. A bulk acoustic resonator comprising:
    a resonating portion comprising a first electrode layer, a piezoelectric layer, and a second electrode layer sequentially stacked on a substrate, wherein the substrate is partitioned into an active region and a non-active region; and
    a frame electrode layer comprising convex portions and concave portions alternately and respectively formed within the active region, along an outer circumference portion of the active region.

11. The bulk acoustic resonator of claim 10, wherein a thickness of each of the convex portions is thicker than that of each of the concave portions.

12. The bulk acoustic resonator of claim 10, wherein as a total length of the concave portions increases, a square value of the effective electromechanical coupling coefficient increases.

13. The bulk acoustic resonator of claim 10, wherein a ratio of a length of each of the convex portions to a length of each of the concave portions is 20% to 200%.

14. The bulk acoustic resonator of claim 10, wherein the active region corresponds to a region in which the first electrode layer, the piezoelectric layer, and the second electrode layer are overlapped in a vertical direction.

15. The bulk acoustic resonator of claim 10, wherein the piezoelectric layer comprises a rare earth metal, and
    the rare earth metal comprises one or any combination of scandium (Sc), erbium (Er), yttrium (Y), and lanthanum (La).

16. The bulk acoustic resonator of claim 15, wherein the piezoelectric layer includes the rare earth metal having 1 at. % to 20 at. %.

17. The bulk acoustic resonator of claim 10, wherein the frame electrode layer is disposed on a flat portion of the second electrode layer.

18. A bulk acoustic resonator, comprising:
- a piezoelectric layer disposed on a substrate having an active region and a non-active region, wherein the piezoelectric layer is disposed between a first electrode layer and a second electrode layer; and
- a frame electrode layer disposed on the second electrode in the active region, the frame electrode layer comprising an annular arrangement of spaced protrusions,
- wherein the frame electrode layer is disposed directly on a flat portion of the second electrode.

19. The bulk acoustic resonator of claim 18, wherein the frame electrode layer is supported by an annular ring.

20. The bulk acoustic resonator of claim 18, wherein the annular arrangement of spaced protrusions defines gaps therebetween.

\* \* \* \* \*